United States Patent [19]

Oie et al.

[11] Patent Number: 5,306,596
[45] Date of Patent: Apr. 26, 1994

[54] POSITIVE RESIST COMPOSITION COMPRISING A POLYPHENOLIC O-QUINONE DIAZIDE SULFONATE

[75] Inventors: Masayuki Oie, Kamakura; Shoji Kawata, Kawasaki; Takamasa Yamada, Komaki; Shinya Ikeda, Yokohama, all of Japan

[73] Assignee: Nippon Zeon Co., Ltd., Tokyo, Japan

[21] Appl. No.: 603,597

[22] Filed: Oct. 26, 1990

[30] Foreign Application Priority Data

Nov. 17, 1989 [JP] Japan .................................. 1-298857

[51] Int. Cl.$^5$ ..................... G03F 7/023; C07C 245/00
[52] U.S. Cl. ..................................... 430/192; 430/165; 430/190; 430/191; 430/193; 534/557
[58] Field of Search ............... 430/190, 192, 193, 165, 430/166, 191; 534/556, 557

[56] References Cited

U.S. PATENT DOCUMENTS

| | | | |
|---|---|---|---|
| 3,188,210 | 6/1965 | Fritz et al. | 430/192 |
| 4,101,323 | 7/1978 | Buhr et al. | 430/177 |
| 4,731,319 | 3/1988 | Kohara et al. | 430/165 |
| 4,906,549 | 3/1990 | Asaumi et al. | 430/165 |
| 5,153,096 | 10/1992 | Uenishi et al. | 430/192 |

FOREIGN PATENT DOCUMENTS

| | | |
|---|---|---|
| 275970 | 1/1988 | European Pat. Off. . |
| 358871 | 7/1989 | European Pat. Off. . |
| 1-189644 | 7/1989 | Japan . |

OTHER PUBLICATIONS

Nagamatsu et al, "Photosensitive Polymers" ISBN 4-0-6-129996-4 1977, pp. 116-122 and 193-196.
Brown et al, "Comparison of modeling and Experimental Results in Contrast Enhancement lithography", SPIE Vol. 920, Advances in Resist Technology and Processing, V 1988, pp. 390-403.
Japanese Patent 1-189644, English Abstract.
Chemical Abstacts vol. 112, 207951n 1990, pp. 638-639.

Primary Examiner—Charles L. Bowers, Jr.
Assistant Examiner—John S. Chu
Attorney, Agent, or Firm—Lowe, Price, LeBlanc & Becker

[57] ABSTRACT

Disclosed herein is a positive resist composition comprising an alkali-soluble phenolic resin and a photosensitive agent, characterized in that the positive resist composition contains, as the photosensitive agent, the quinonediazide sulfonate of at least one of phenolic compounds represented by the following general formulae (I) and (II):

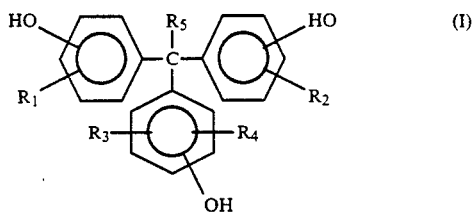

wherein $R_1$ through $R_4$ mean individually a hydrogen or halogen atom, a hyaroxyl group, an alkyl or alkenyl group having 1-3 carbon atoms, or a hydroxyalkyl group having 1-3 carbon atoms and may be equal to or different from one another, and $R_5$ denotes a hydrogen atom, an alkyl or alkenyl group having 1-3 carbon atoms, or an aryl group with the proviso that the number of hydroxyl groups is 3 or 4; and

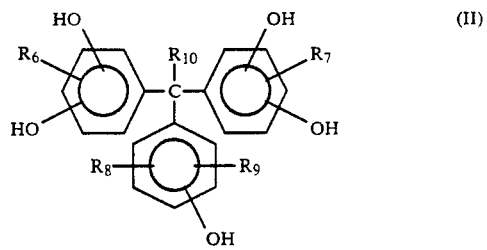

wherein $R_6$ through $R_9$ mean individually a hydrogen or halogen atom, an alkyl or alkenyl group having 1-3 carbon atoms, or a hydroxyalkyl group having 1-3 carbon atoms and may be equal to or different from one another, and $R_{10}$ denotes a hydrogen atom, an alkyl or alkenyl group having 1-3 carbon atoms, or an aryl group with the proviso that the number of hydroxyl groups is 5 and at least one of $R_6$ through $R_9$ is an atom or group other than hydrogen atom. It is suitable for use in minute processing.

3 Claims, No Drawings

POSITIVE RESIST COMPOSITION COMPRISING A POLYPHENOLIC O-QUINONE DIAZIDE SULFONATE

FIELD OF THE INVENTION

The present invention relates to a positive resist composition, and more specifically to a positive resist composition suitable for use in minute processing required for the fabrication of semiconductor devices, magnetic bubble memory devices, integrated circuits and the like.

BACKGROUND OF THE INVENTION

Upon the fabrication of a semiconductor, a semiconductor device is formed by a lithography technique in which a resist is applied on the surface of a silicon wafer to form a photosensitive film, the film is exposed to light so as to form a latent image and the latent image is then developed to form a negative or positive image.

A negative resist composed of cyclized polyisoprene and a bisdiazide compound has heretofore been known as a resist composition for the fabrication of semiconductor devices. However, the negative resist involves a drawback that it cannot be accommodated to the fabrication of semiconductors integrated to high degrees because it is developed with an organic solvent, so that it swells to a significant extent and its resolving power is hence limited.

On the other hand, positive resist compositions are believed that they can be satisfactorily accommodated to the integration of semiconductors to a high degree because they are excellent in resolving power compared with the negative resist composition. Positive resist compositions composed of a novolak resin and a quinonediazide compound have been generally used in this field to date.

However, satisfactory results as to various properties such as sensitivity, rate of residual film, resolution, heat resistance and storage stability are not necessarily obtained from the conventional positive resist compositions. There has been a strong demand for enhancing the performance of the positive resist compositions.

OBJECTS AND SUMMARY OF THE INVENTION

It is an object of this invention is to provide a positive resist composition excellent in various properties such as sensitivity, rate of residual film, resolution, heat resistance and storage stability and suitable for use in minute processing to 1 μm or smaller in line width.

The object of this invention can be achieved by providing a positive resist composition comprising an alkali-soluble phenolic resin and a photosensitive agent, characterized in that the positive resist composition contains, as the photosensitive agent, the quinonediazide sulfonate of at least one of phenolic compounds represented by the following general formulae (I) and (II):

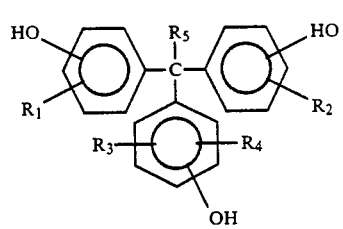

(I)

wherein $R_1$ through $R_4$ mean individually a hydrogen or halogen atom, a hydroxyl group, an alkyl or alkenyl group having 1-3 carbon atoms, or a hydroxyalkyl group having 1-3 carbon atoms and may be equal to or different from one another, and $R_5$ denotes a hydrogen atom, an alkyl or alkenyl group having 1-3 carbon atoms, or an aryl group with the proviso that the number of hydroxyl groups is 3 or 4; and

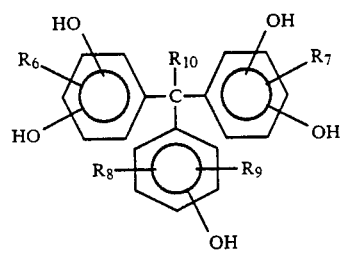

(II)

wherein $R_6$ through $R_9$ mean individually a hydrogen or halogen atom, an alkyl or alkenyl group having 1-3 carbon atoms, or a hydroxyalkyl group having 1-3 carbon atoms and may be equal to or different from one another, and $R_{10}$ denotes a hydrogen atom, an alkyl or alkenyl group having 1-3 carbon atoms, or an aryl group with the proviso that the number of hydroxyl groups is 5 and at least one of $R_6$ through $R_9$ is an atom or group other than hydrogen atom.

DETAILED DESCRIPTION OF THE INVENTION

Alkali-Soluble Phenolic Resin

As exemplary alkali-soluble phenolic resins useful in the practice of this invention, may be mentioned condensation products of a phenol and an aldehyde, condensation products of a phenol and a ketone, vinylphenol polymers, isopropenylphenol polymers and hydrogenation products of these phenolic resins.

As specific examples of the phenols usable herein, may be mentioned monohydric phenols such as phenol, cresol, xylenol, ethylphenol, propylphenol, butylphenol and phenylphenol, and polyhydric phenols such as resorcinol, pyrocatechol, hydroquione, bisphenol A and pyrogallol.

As specific examples of the aldehydes usable herein, may be mentioned formaldehyde, acetoaldehyde, benzaldehyde and terephthalaldehyde.

As specific examples of the ketones usable herein, may be mentioned acetone, methyl ethyl ketone, diethyl ketone and diphenyl ketone.

The condensation reaction of their corresponding compounds mentioned above can be performed in accordance with a method known per se in the art.

The vinylphenolic polymer is selected from a homopolymer of vinylphenol and copolymers of vinylphenol and a component copolymerizable therewith. As specific examples of the copolymerizable component, may be mentioned acrylic acid, methacrylic acid, styrene, maleic anhydride, maleinimide, vinyl acetate, acrylonitrile and derivatives thereof.

The isopropenylphenolic polymer is selected from a homopolymer of isopropenylphenol and copolymers of isopropenylphenol and a component copolymerizable therewith. As specific examples of the copolymerizable component, may be mentioned acrylic acid, methacrylic acid, styrene, maleic anhydride, maleinimide, vinyl acetate, acrylonitrile and derivatives thereof.

When a hydrogenation product of a phenolic resin is used herein, it can be prepared by any optional known method. Described specifically, it is obtained by dissolving the phenolic resin in an organic solvent and then introducing hydrogen into the solution in the presence of a homogeneous or heterogeneous hydrogenation catalyst.

These alkali-soluble phenolic resins may be used either singly or in combination.

For example, a copolymer of styrene and acrylic acid, methacrylic acid or maleic anhydride, a copolymer of an alkene and maleic anhydride, a polymer of vinyl alcohol, a polymer of vinylpyrrolidone, rosin, shellac and/or the like may be optionally added to the positive resist composition according to this invention in order to improve its developability, storage stability, heat resistance, etc. The amount of these optional components to be added is 0–50 parts by weight, preferably 5–20 parts by weight per 100 parts by weight of the alkali-soluble phenolic resin.

Photosensitive Agent

No particular limitation is imposed on the photosensitive agent useful in the practice of this invention so long as it is the quinonediazide sulfonate of at least one of phenolic compounds represented by the general formulae (I) and (II).

The quinonediazide sulfonate of a phenolic compound means an ester of at least one of the phenolic compounds represented by the general formulae (I) and (II) with a quinonediazide sulfonic compound.

As exemplary quinonediazide sulfonic compounds, may be mentioned o-quinonediazide sulfonic acids such as 1,2-benzoquinonediazide-4-sulfonic acid, 1,2-naphthoquinonediazide-4-sulfonic acid, 1,2-naphthoquinonediazide-5-sulfonic acid, 2,1-naphthoquinonediazide-4-sulfonic acid and 2,1-naphthoquinonediazide-5-sulfonic acid, and other quinonediazide derivatives.

The quinonediazide sulfonate of a phenolic compound can be synthesized by the esterification reaction of the phenolic compound with a quinonediazide sulfonic compound, for example, by a method in which the quinonediazide sulfonic compound is reacted with chlorosulfonic acid to form a sulfonyl chloride and the thus-formed sulfonyl chloride is then condensed with the phenolic compound having hydroxyl group(s) in accordance with the conventional method.

The compound serving as a raw material for the photosensitive agent used in this invention and represented by the general formula (I) is required to have 3–4 hydroxyl groups in its molecule and 0–4 substituent groups other than the hydroxyl group, which are bonded to the phenolic nuclei. The compound represented by the general formula (II) is required to have 5 hydroxyl groups in its molecule and 1–4 substituent groups other than the hydroxyl group, which are bonded to the phenolic nuclei. The use of any photosensitive agents synthesized from phenolic compounds in which the number of hydroxyl groups in the molecule are more than the above upper limits will result in positive resist compositions showing a tendency to deteriorate the form of pattern and to greatly change the line width of a pattern to be formed depending on the energy upon exposure. On the other hand, any phenolic compounds having less hydroxyl groups than the above lower limits will result in positive resist compositions showing a tendency to degrade their sensitivity.

The use of any photosensitive agents synthesized from phenolic compounds in which the substituent groups other than the hydroxyl group are bulky or its number is many will also result in positive resist compositions showing a tendency to degrade their sensitivity. It is hence unpreferable to use such a photosensitive agent.

As specific examples of the compounds represented by the general formulae (I) and (II), may be mentioned the following compounds:

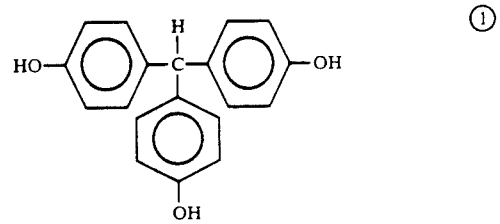

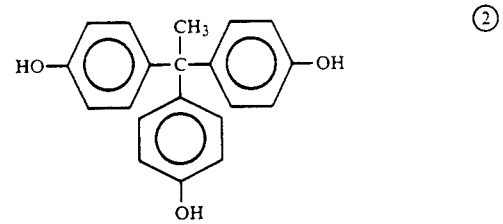

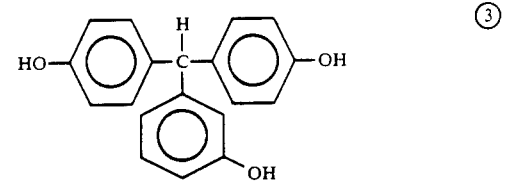

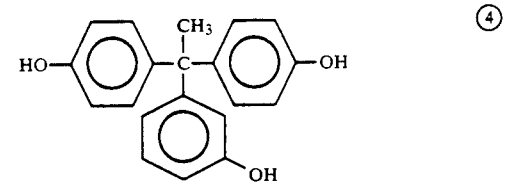

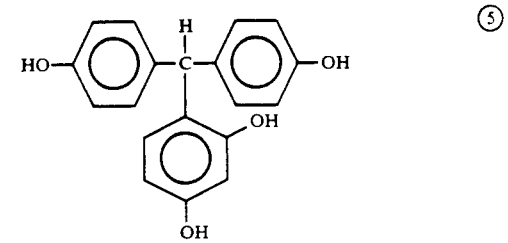

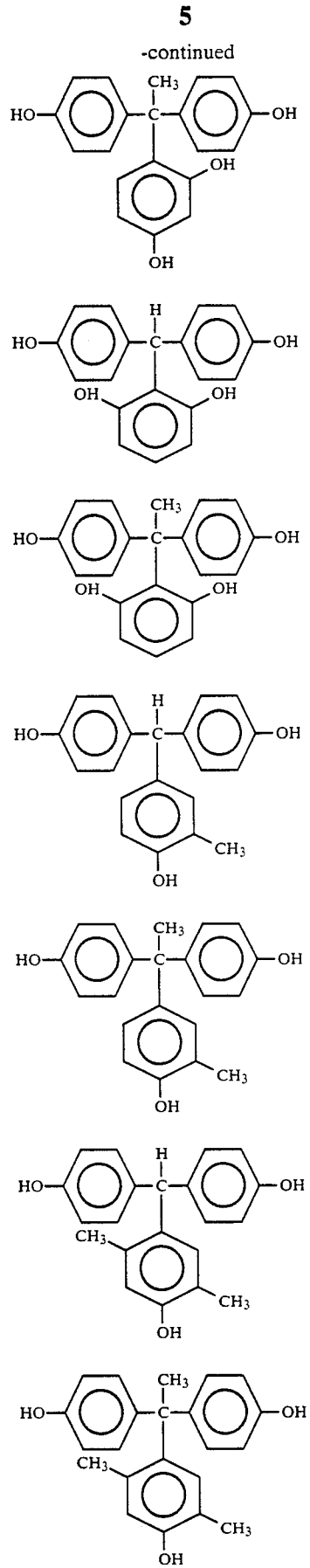

-continued

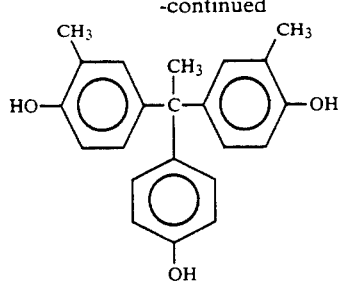

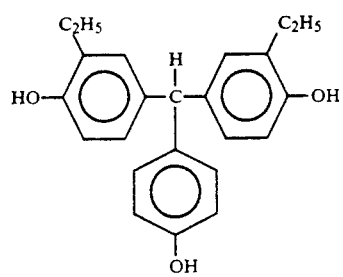

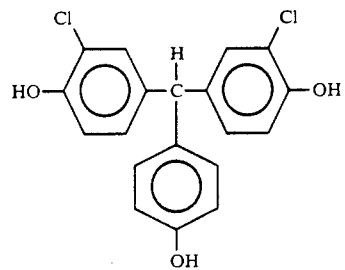

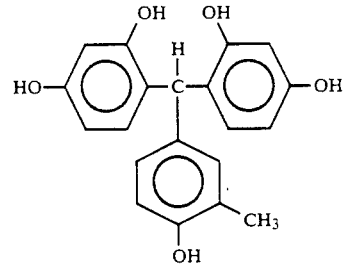

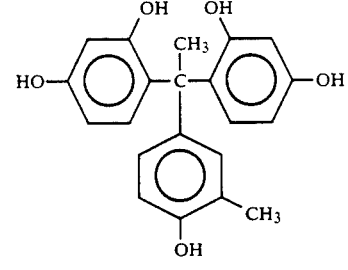

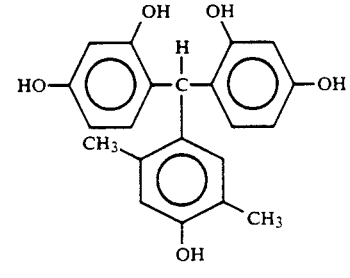

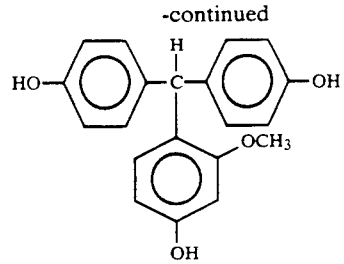

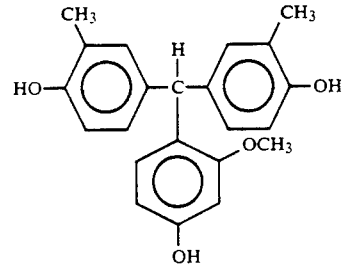

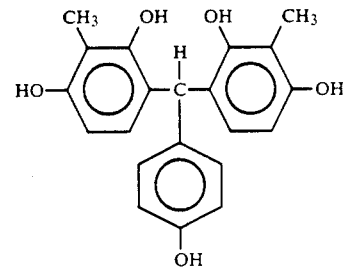

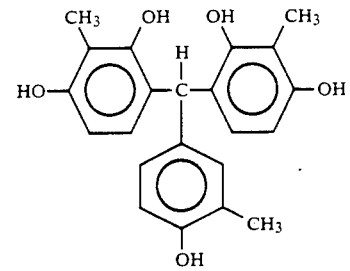

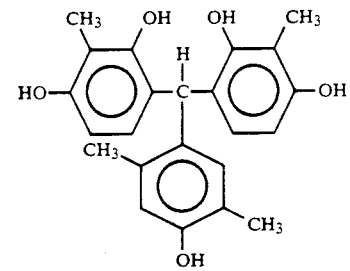

In the photosensitive agent useful in the practice of this invention, no particular limitation is imposed on the esterification degree of the quinonediazide sulfonic compound to the phenolic compound represented by the general formula (I) or (II), but it generally falls in a range of 50-100 mol %, preferably, of 60-100 mol %, particularly preferably, of 65-95 mol %. Any esterification degrees lower than 50 mol % will bring about the deterioration in the form of pattern and resolution. On the other hand, any esterification degrees too high may possibly bring about the deterioration of sensitivity.

No particular limitation is imposed on the proportion of the photosensitive agent (the quinonediazide sulfonate) used in the present invention to the alkali-soluble phenolic resin component. However, the proportion is preferably 5–50 parts by weight per 100 parts by weight of the resin, with 10–40 parts by weight being particularly preferred. Any proportions lower than 5 parts by weight will make it impossible to form any patterns having a sufficient rate of residual film and bring about the deterioration of resolution. Any proportions higher than 50 parts by weight will bring about the deterioration of sensitivity and heat resistance. It is hence unpreferable to use the photosensitive agent in an amount outside the above range.

The photosensitive agent useful in the practice of this invention, namely, the specific quinonediazide sulfonate described above may be used either singly or in combination with at least one photosensitive agent of a different kind. No particular limitation is imposed on the combining photosensitive agent so long as it is a general quinonediazide sulfonate. As specific examples of such a photosensitive agent, may be mentioned the quinonediazide sulfonates of cresol, xylenol, resorcine, catechol, hydroquinone, pyrogallol, fluoroglucinol, fluoroglucide, 2,3,4-trihydroxybenzophenone, 2,4,4'-trihydroxybenzophenone, 2,3,4,4'-tetrahydroxybenzophenone, 2,2',4,4'-tetrahydroxybenzophenone, 2,2',3,4,4'-pentahydroxybenzophenone, 2,2',3,4,5'-pentahydroxybenzophenone, 2,3,3',4,5'-pentahydroxybenzophenone, 2,3,3',4,4',5'-hexahydroxybenzophenone, 2,3',4,4',5',6-hexahydroxybenzophenone, methyl gallate, ethyl gallate, propyl gallate, 2,2-bis(4-hydroxyphenyl)propane, 2,2-bis(2,4-dihydroxyphenyl)propane, 2,2-bis(2,3,4-trihydroxyphenyl)propane, cresol novolak resins, resorcine-acetone resins, pyrogallol-acetone resins, polyvinylphenol resins and copolymers of vinylphenol.

Other components

The positive resist composition according to this invention is used in a state that it is dissolved in a solvent. As exemplary solvents, may be mentioned ketones such as acetone, methyl ethyl ketone, cyclohexanone and cyclopentanone; alcohols such as n-propyl alcohol, isopropyl alcohol, n-butyl alcohol and cyclohexanol; ethers such as ethylene glycol dimethyl ether, ethylene glycol diethyl ether and dioxane; alcohol ethers such as ethylene glycol monomethyl ether and ethylene glycol monoethyl ether; esters such as propyl formate, butyl formate, propyl acetate, butyl acetate, methyl propionate, ethyl propionate, methyl butyrate, ethyl butyrate, methyl lactate and ethyl lactate; cellosolve esters such as cellosolve acetate, methylcellosolve acetate, ethylcellosolve acetate, propylcellosolve acetate and butylcellosolve acetate; propylene glycols such as propylene glycol, propylene glycol monomethyl ether, propylene glycol monomethyl ether acetate, propylene glycol monobutyl ether acetate and propylene glycol monobutyl ether; diethylene glycols such as diethylene glycol monomethyl ether, diethylene glycol monoethyl ether, diethylene glycol dimethyl ether, diethylene glycol diethyl ether and diethylene glycol methyl ethyl ether; halogenated hydrocarbons such as trichloroethylene; aromatic hydrocarbons such as toluene and xylene; and polar solvents such as dimethylacetamide, dimethylformamide and N-methylacetamide. These solvents may be used either singly or in combination.

In the positive resist composition according to this invention, may be contained one or more of compatible additives such as a dye, surfactant, storage stabilizer, sensitizer, anti-striation agent and plasticizer, as needed.

Developer

An aqueous solution of an alkali is used as a developer for the positive resist composition of this invention. As specific examples of the alkali, may be mentioned inorganic alkalis such as sodium hydroxide, potassium hydroxide, sodium silicate and ammonia; primary amines such as ethylamine and propylamine; secondary amines such as diethylamine and dipropylamine; tertiary amines such as trimethylamine and triethylamine; alcohol amines such as dimethylmethanolamine and triethanolamine; and quaternary ammonium salts such as tetramethylammonium hydroxide, tetraethylammonium hydroxide, trimethylhydroxymethylammonium hydroxide, triethylhydroxymethylammonium hydroxide and trimethylhydroxyethylammonium hydroxide.

If necessary, suitable amounts of a water-soluble organic solvent such as methanol, ethanol, propanol or ethylene glycol, a surfactant, a storage stabilizer, a dissolution inhibitor for the resin and/or the like may be added further to the aqueous alkali solution.

ADVANTAGES OF THE INVENTION

Since the positive resist composition according to this invention is excellent in various properties such as density, resolution, rate of residual film, heat resistance, etc., it is suitable in particular for use in minute processing to 1 μm or smaller in line width.

EMBODIMENTS OF THE INVENTION

The present invention will hereinafter be described more specifically by the following Examples. Incidentally, all designations of "part" or "parts" and "%" as will be used in the following Examples mean part or parts by weight and wt. % unless otherwise provided.

EXAMPLE 1

A novolak resin (an alkali-soluble phenolic resin) was obtained by mixing m-cresol and p-cresol at a molar ratio of 6:4, adding formaline thereto and condensing them by a method known per se in the art using an oxalic acid catalyst.

On the other hand, a phenolic compound represented by the formula ① and 1,2-naphthoquinonediazide-5-sulfonyl chloride in an amount corresponding to 70 mol % of the —OH groups in the phenolic compound were dissolved in dioxane, to which triethylamine was added to esterify them, thereby obtaining a photosensitive agent (the quinonediazide sulfonate of the phenolic compound).

One hundred parts of the above-described alkali-soluble phenolic resin and 30 parts of the photosensitive agent were dissolved in 350 parts of ethyl lactate. The resulting solution was filtered through a polytetrafluoroethylene (hereinafter abbreviated as "PTFE") filter having a pore size of 0.1 μm to prepare a resist solution.

After applying the thus-prepared resist solution by a coater on a silicon wafer, the resist solution was baked for 90 seconds at 100° C., thereby forming a resist film having a thickness of 1.17 μm.

The thus-formed resist film was exposed using a g-line stepper, "NSR-1505G6E" (manufactured by Nikon Corp., NA=0.54) and a test reticle. The thus-exposed film was then developed by the puddle process for 1 minute at 23° C. in a 2.38% aqueous solution of tetramethylammonium hydroxide, thereby forming a positive pattern.

The wafer with the pattern formed thereon was taken out of the aqueous alkali solution to observe it through an electron microscope. As a result, it was found that a 1:1 line and space pattern of 0.65 μm was formed according to the designed dimensions at an exposure of 390 msec and at this time, alternate lines and spaces were resolved at intervals of 0.50 μm. At an exposure of 440 msec, alternate lines and spaces were resolved at intervals of 0.45 μm. This pattern was perpendicular in profile and good in form. The film thickness of the pattern was measured and was found to be 1.15 μm (ratio of residual film: 98.3%).

EXAMPLE 2

A phenolic compound represented by the formula 17 and 1,2-naphthoquinonediazide-5-sulfonyl chloride in an amount corresponding to 65 mol % of the —OH groups in the phenolic compound were dissolved in dioxane, to which triethylamine was added to esterify them, thereby obtaining a photosensitive agent.

One hundred parts of the same alkali-soluble phenolic resin as that used in Example 1 and 30 parts of the photosensitive agent were dissolved in 360 parts of ethyl lactate. The resulting solution was filtered through a PTFE filter having a pore size of 0.1 μm to obtain a resist solution.

Using the thus-obtained resist solution, a pattern was formed in the same manner as in Example 1 to observe it through an electron microscope. As a result, it was found that a 1:1 line and space pattern of 0.65 μm was formed according to the designed dimensions at an exposure of 400 msec and at this time, alternate lines and spaces were resolved at intervals of 0.50 μm. At an exposure of 440 msec, alternate lines and spaces were resolved at intervals of 0.45 μm. This pattern was perpendicular in profile and good in form. The film thickness of the pattern was measured and was found to be 1.16 μm (ratio of residual film: 99.1%).

EXAMPLE 3

A novolak resin (an alkali-soluble phenolic resin) was obtained by mixing m-cresol and p-cresol at a molar ratio of 4:6, adding formaline thereto and condensing them by a method known per se in the art using an oxalic acid catalyst.

On the other hand, a phenolic compound represented by the formula ① and 1,2-naphthoquinonediazide-5-sulfonyl chloride in an amount corresponding to 90 mol % of the —OH groups in the phenolic compound were dissolved in dioxane, to which triethylamine was added to esterify them, thereby obtaining a photosensitive agent.

One hundred parts of the above-described alkali-soluble phenolic resin and 30 parts of the photosensitive agent were dissolved in 350 parts of ethyl lactate. The resulting solution was filtered through a PTFE filter having a pore size of 0.1 μm to prepare a resist solution.

After applying the thus-prepared resist solution on a silicon wafer, the resist solution was baked for 90 seconds at 90° C., thereby forming a resist film having a thickness of 1.17 μm. The thus-formed resist film was exposed using a g-line stepper, "NSR-1505G6E" (manufactured by Nikon Corp., NA=0.54) and a test reticle. The thus-exposed resist film was then subjected to PEB (post-exposure baking) for 60 seconds at 110° C., followed by its development by the puddle process for 1 minute at 23° C. in the 2.38% aqueous solution of tetramethylammonium hydroxide to form a positive pattern.

The wafer with the pattern formed thereon was taken out of the aqueous alkali solution to observe it through an electron microscope. As a result, it was found that a 1:1 line and space pattern of 0.65 μm was formed according to the designed dimensions at an exposure of 400 msec and at this time, alternate lines and spaces were resolved at intervals of 0.45 μm. At an exposure of 430 msec, alternate lines and spaces were resolved at intervals of 0.40 μm. This pattern was perpendicular in profile and good in form.

Using a dry etching apparatus, "DEM-451T" (manufactured by Nichiden Anelva Company), the wafer with the pattern formed thereon was then etched with a 3:1 mixed gas of $CF_4$ and $H_2$ at a power of 300 W, a pressure of 0.03 Torr and a frequency of 13.56 MHz. As a result, it was found that portions of the wafer, on which no pattern had been formed, were only etched.

EXAMPLE 4

A phenolic compound represented by the formula ② and 1,2-naphthoquinonediazide-5-sulfonyl chloride in an amount corresponding to 90 mol % of the —OH groups in the phenolic compound were dissolved in dioxane, to which triethylamine was added to esterify them, thereby obtaining a photosensitive agent.

One hundred parts of the same alkali-soluble phenolic resin as that used in Example 3 and 30 parts of the photosensitive agent were dissolved in 360 parts of ethyl lactate. The resulting solution was filtered through a PTFE filter having a pore size of 0.1 μm to obtain a resist solution.

Using the thus-obtained resist solution, a pattern was formed in the same manner as in Example 3 to observe it through an electron microscope. As a result, it was found that a 1:1 line and space pattern of 0.65 μm was formed according to the designed dimensions at an exposure of 410 msec and at this time, alternate lines and spaces were resolved at intervals of 0.45 μm. At an exposure of 450 msec, alternate lines and spaces were resolved at intervals of 0.40 μm. This pattern was perpendicular in profile and good in form.

EXAMPLE 5

A phenolic compound represented by the formula ⑥ and 1,2-naphthoquinonediazide-5-sulfonyl chloride in an amount corresponding to 98 mol % of the —OH groups in the phenolic compound were dissolved in dioxane, to which triethylamine was added to esterify them, thereby obtaining a photosensitive agent.

One hundred parts of the same alkali-soluble phenolic resin as that used in Example 1 and 25 parts of the photosensitive agent were dissolved in 350 parts of ethyl lactate. The resulting solution was filtered through a PTFE filter having a pore size of 0.1 μm to obtain a resist solution.

Using the thus-obtained resist solution, a pattern was formed in the same manner as in Example 3 to observe it through an electron microscope. As a result, it was found that a 1:1 line and space pattern of 0.65 μm was formed according to the designed dimensions at an exposure of 390 msec and at this time, alternate lines and spaces were resolved at intervals of 0.45 μm. At an exposure of 430 msec, alternate lines and spaces were resolved at intervals of 0.40 μm. This pattern was perpendicular in profile and good in form.

EXAMPLE 6

A phenolic compound represented by the formula 17 and 1,2-naphthoquinonediazide-5-sulfonyl chloride in an amount corresponding to 85 mol % of the —OH groups in the phenolic compound were dissolved in dioxane, to which triethylamine was added to esterify them, thereby obtaining a photosensitive agent.

One hundred parts of the same alkali-soluble phenolic resin as that used in Example 3 and 30 parts of the photosensitive agent were dissolved in 360 parts of ethyl lactate. The resulting solution was filtered through a PTFE filter having a pore size of 0.1 μm to obtain a resist solution.

Using the thus-obtained resist solution, a pattern was formed in the same manner as in Example 3 to observe it through an electron microscope. As a result, it was found that a 1:1 line and space pattern of 0.65 μm was formed according to the designed dimensions at an exposure of 420 msec and at this time, alternate lines and spaces were resolved at intervals of 0.45 μm. At an exposure of 470 msec, alternate lines and spaces were resolved at intervals of 0.40 μm. This pattern was perpendicular in profile and good in form.

EXAMPLE 7

After applying the resist solution obtained in Example 3 on a silicon wafer, the resist solution was baked for 90 seconds at 90° C., thereby forming a resist film having a thickness of 1.20 μm. The thus-formed resist film was exposed using an i-line stepper, "ALS WAFERSTEP 2142i" (manufactured by General Signal Company, NA=0.42) and a test reticle. The thus-exposed resist film was then subjected to PEB for 60 seconds at 110° C., followed by its development by the puddle process for 1 minute at 23° C. in the 2.38% aqueous solution of tetramethylammonium hydroxide to form a positive pattern.

The wafer with the pattern formed thereon was taken out of the aqueous alkali solution to observe it through an electron microscope. As a result, it was found that a 1:1 line and space pattern of 0.70 μm was formed according to the designed dimensions at an exposure of 320 msec and at this time, alternate lines and spaces were resolved at intervals of 0.50 μm. At an exposure of 370 msec, alternate lines and spaces were resolved at intervals of 0.45 μm. This pattern was perpendicular in profile and good in form.

EXAMPLE 8

One hundred parts of the same alkali-soluble phenolic resin as that used in Example 1 and 20 parts of the same photosensitive agent as that used in Example 5 were dissolved in 350 parts of ethyl lactate. The resulting solution was filtered through a PTFE filter having a pore size of 0.1 μm to prepare a resist solution.

Using the thus-prepared resist solution, a pattern was formed in the same manner as in Example 3 to observe it through an electron microscope. As a result, it was found that a 1:1 line and space pattern of 0.70 μm was formed according to the designed dimensions at an exposure of 300 msec and at this time, alternate lines and spaces were resolved at intervals of 0.50 μm. At an exposure of 430 msec, alternate lines and spaces were resolved at intervals of 0.45 μm. This pattern was perpendicular in profile and good in form.

EXAMPLE 9

One hundred parts of the same alkali-soluble phenolic resin as that used in Example 3 and 25 parts of the same photosensitive agent as that used in Example 6 were dissolved in 350 parts of ethyl lactate. The resulting solution was filtered through a PTFE filter having a pore size of 0.1 μm to prepare a resist solution.

Using the thus-prepared resist solution, a pattern was formed in the same manner as in Example 7 to observe it through an electron microscope. As a result, it was found that a 1:1 line and space pattern of 0.70 μm was formed according to the designed dimensions at an exposure of 300 msec and at this time, alternate lines and spaces were resolved at intervals of 0.50 μm. At an exposure of 430 msec, alternate lines and spaces were resolved at intervals of 0.45 μm. This pattern was perpendicular in profile and good in form.

EXAMPLE 10

A phenolic compound represented by the formula 9 and 1,2-naphthoquinonediazide-5-sulfonyl chloride in an amount corresponding to 90 mol % of the —OH groups in the phenolic compound were dissolved in dioxane, to which an aqueous solution of sodium hydrogencarbonate was added to esterify them, thereby obtaining a photosensitive agent.

One hundred parts of the same alkali-soluble phenolic resin as that used in Example 3 and 25 parts of the photosensitive agent were dissolved in 350 parts of ethyl lactate. The resulting solution was filtered through a PTFE filter having a pore size of 0.1 μm to prepare a resist solution.

Using the thus-prepared resist solution, a pattern was formed in the same manner as in Example 7 to observe it through an electron microscope. As a result, it was found that a 1:1 line and space pattern of 0.70 μm was formed according to the designed dimensions at an exposure of 280 msec and at this time, alternate lines and spaces were resolved at intervals of 0.50 μm. At an exposure of 340 msec, alternate lines and spaces were resolved at intervals of 0.45 μm.

EXAMPLE 11

2,3,4,4'-Tetrahydroxybenzophenone and 1,2-naphthoquinonediazide-5-sulfonyl chloride in an amount corresponding to 95 mol % of the —OH groups in the phenolic compound were dissolved in dioxane, to which triethylamine was added to esterify them, thereby obtaining a photosensitive agent.

One hundred parts of the same alkali-soluble phenolic resin as that used in Example 3, 20 parts of the same photosensitive agent as that used in Example 3 and 10 parts of the above-obtained photosensitive agent were dissolved in 360 parts of ethyl lactate. The resulting solution was filtered through a PTFE filter having a pore size of 0.1 μm to obtain a resist solution.

Using the thus-obtained resist solution, a pattern was formed in the same manner as in Example 3 to observe it through an electron microscope. As a result, it was found that a 1:1 line and space pattern of 0.65 μm was formed according to the designed dimensions at an exposure of 290 msec and at this time, alternate lines and spaces were resolved at intervals of 0.45 μm. At an exposure of 330 msec, alternate lines and spaces were resolved at intervals of 0.40 μm.

EXAMPLE 12

One hundred parts of an hydrogenation product of a vinylphenol polymer as an alkali-soluble resin and 10 parts of the same photosensitive agent as that used in Example 10 were dissolved in 320 parts of diglyme. The resulting solution was filtered through a PTFE filter having a pore size of 0.1 μm to obtain a resist solution.

After applying the resist solution by a coater on a silicon wafer, the resist solution was baked for 90 seconds at 100° C., thereby forming a resist film having a thickness of 1.0 μm. The thus-formed resist film was exposed using a KrF excimer laser, "C2926" (manufactured by Hamamatsu Photonics K. K.) and a test mask. The thus-exposed film was then developed by the puddle process for 1 minute at 23° C. in a 2.0% aqueous solution of tetramethylammonium hydroxide to form a positive pattern.

The wafer on which the pattern had been formed was taken out of the aqueous alkali solution to observe it through an electron microscope. As a result, it was found that alternate lines and spaces were resolved at intervals of 0.45 μm at an exposure of 240 mJ/cm².

Comparative Example 1

4,4'-Dihydroxy-triphenylmethane and 1,2-naphthoquinonediazide-5-sulfonyl chloride in an amount corresponding to 90 mol % of the —OH groups in the phenolic compound were dissolved in dioxane, to which triethylanine was added to esterify them, thereby obtaining a photosensitive agent.

One hundred parts of the same alkali-soluble phenolic resin as that used in Example 3 and 35 parts of the above-obtained photosensitive agent were dissolved in 360 parts of ethyl lactate. The resulting solution was filtered through a PTFE filter having a pore size of 0.1 μm to obtain a resist solution.

Using the thus-obtained resist solution, a pattern was formed in the same manner as in Example 3 to observe it through an electron microscope. As a result, it was found that a 1:1 line and space pattern of 0.65 μm was formed according to the designed dimensions at an exposure of 610 msec and at this time, alternate lines and spaces were resolved at intervals of 0.45 μm. However, an exposure of 730 msec was required to resolve alternate lines and spaces at intervals of 0.40 μm.

Comparative Example 2

2,2',4,4',4''-Pentahydroxy-triphenylmethane and 1,2-naphthoquinonediazide-5-sulfonyl chloride in an amount corresponding to 65 mol % of the —OH groups in the phenolic compound were dissolved in dioxane, to which triethylamine was added to esterify them, thereby obtaining a photosensitive agent.

One hundred parts of the same alkali-soluble phenolic resin as that used in Example 1 and 25 parts of the above-obtained photosensitive agent were dissolved in 350 parts of ethyl lactate. The resulting solution was filtered through a PTFE filter having a pore size of 0.1 μm to obtain a resist solution.

Using the thus-obtained resist solution, a pattern was formed in the same manner as in Example 1 to observe it through an electron microscope. As a result, it was found that a 1:1 line and space pattern of 0.65 μm was formed according to the designed dimensions at an exposure of 330 msec, but at this time, alternate lines and spaces were resolved only up to intervals of 0.50 μm. At an exposure of 380 msec, alternate lines and spaces were resolved at intervals of 0.45 μm, but the pattern became round in its top portion and the rate of residual film was remarkably lowered.

We claim:

1. A positive resist composition comprising in admixture:
   (i) 100 parts by weight of an alkali-soluble phenolic resin;
   (ii) 5–50 parts by weight of a photosensitive agent formed of a quinonediazide sulfonate of the following phenolic compound

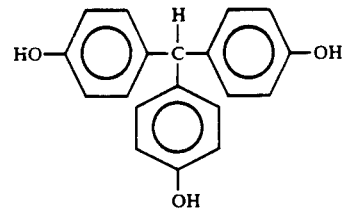

wherein the —OH groups have been converted into the ester groups with a quinonediazide sulfonic compound to an extent of 85–100 mole %. and;
   (iii) sufficient solvent to dissolve the foregoing components.

2. A positive resist composition comprising in admixture:
   (i) 100 parts by weight of an alkali-soluble phenolic resin;
   (ii) 5–50 parts by weight of a photosensitive agent formed of a quinonediazide sulfonate of the following phenolic compound

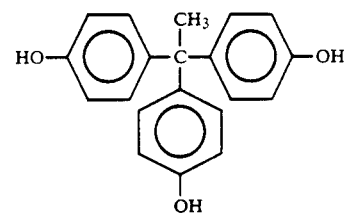

wherein the —OH groups have been converted into the ester groups with a quinonediazide sulfonic compound to an extend of 85–100 mole %, and;
   (iii) sufficient solvent to dissolve the foregoing components.

3. A positive resist composition comprising in admixture:
   (i) 100 parts by weight of an alkali-soluble phenolic resin;
   (ii) 5–50 parts by weight of a photosensitive agent formed of a quinonediazide sulfonate of the following phenolic compound

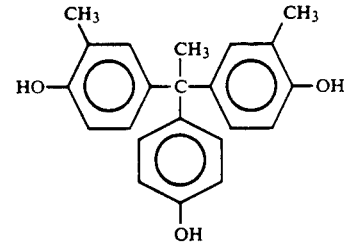

wherein the —OH groups have been converted into the ester groups with a quinonediazide sulfonic compound to an extent of 85–100 mole %, and;
   (iii) sufficient solvent to dissolve the foregoing components.

* * * * *